United States Patent
Watanabe

[19]

[11] Patent Number: 6,031,855
[45] Date of Patent: Feb. 29, 2000

[54] LIGHT EMITTING ELEMENT DRIVING CIRCUIT AND LIGHT EMITTING DEVICE HAVING THE SAME

[75] Inventor: Hisako Watanabe, Kawasaki, Japan

[73] Assignee: Fujitsu Limited, Kawasaki, Japan

[21] Appl. No.: 08/810,710

[22] Filed: Mar. 3, 1997

[30] Foreign Application Priority Data

Mar. 29, 1996 [JP] Japan ................................ 8-077941

[51] Int. Cl.[7] ........................................................ H01S 3/00
[52] U.S. Cl. ................................................................ 372/38
[58] Field of Search ............................ 372/38; 362/800; 315/199, 208, 209 T, 313; 250/216; 331/108 R

[56] References Cited

U.S. PATENT DOCUMENTS 4,182,977  1/1980  Stricklin, Jr. .

FOREIGN PATENT DOCUMENTS

| 5717854 | 10/1982 | European Pat. Off. . |
|---|---|---|
| 62-296574 | 12/1987 | Japan . |
| 3-126273 | 5/1991 | Japan . |
| 5-315686 | 11/1993 | Japan . |
| 6-139607 | 5/1994 | Japan . |

OTHER PUBLICATIONS

*Patent Abstracts of Japan,* vol. 007, No. 013 (E–153), Jan. 19, 1983 & JP 57 171854 A (Nippon Denki KK), Oct. 22, 1982.

*Patent Abstracts of Japan,* vol. 007, No. 088, (E–170), Apr. 12, 1983 & JP 58 014584 A (Ricoh KK), Jan. 27, 1983.

*Patent Abstracts of Japan,* vol. 008, No. 029 (E–226), Feb. 7, 1984 & JP 58 190085 A (Fujitsu KK), Nov. 5, 1983.

*Patent Abstracts of Japan,* vol. 008, 139 (E–253), Jun. 28, 1984 & JP 59 050586 A (Nihon Kougaku Kogyo KK), Mar. 23, 1984.

*Patent Abstracts of Japan,* vol. 013, No. 155 (E–743), Apr. 14, 1989 & JP 63 312687 A (Nippon Telegraph & Telephone Corp.), Dec. 21, 1988.

*Patent Abstracts of Japan,* vol.. 013, No. 114, (e–730), Mar. 20, 1989 & JP 63 285990 A (Nippon Telegraph & Telephone Corp.), Nov. 22, 1988.

Price, John P., *A Laser Diode Current Driver with Photo-diode Sense Amplifier for Optical Disk Drive,* Proceedings of the Bipolar Circuits and Technology Meeting, Minneapolis, Sep. 9–10, 1991, No. 9, Sep. 9, 1991, pp. 241–244.

*Primary Examiner*—Rodney Bovernick
*Assistant Examiner*—Robert E. Wise
*Attorney, Agent, or Firm*—Staas & Halsey, LLP

[57] ABSTRACT

A light emitting element driving circuit which drives a light emitting element including the following. A drive transistor is coupled to a power supply voltage and is provided on a side of an anode of the light emitting element. The drive transistor receives an input signal and supplies the light emitting element with a pulse current and a bias current. A cathode of the light emitting element is connected to a lower potential than the power supply voltage.

22 Claims, 19 Drawing Sheets

LIGHT EMITTING ELEMENT DRIVING CIRCUIT AND LIGHT EMITTING DEVICE HAVING THE SAME

BACKGROUND OF THE INVENTION

1. Field of the Invention

The present invention generally relates to a light emitting element driving circuit and a light emitting device having such a driving circuit. More particularly, the present invention is concerned with a light emitting element driving circuit capable of driving a light emitting element at a high speed without being affected by noise when the light emitting element is driven with a positive power supply voltage.

Recently, light emitting elements such as semiconductor laser diodes have been widely used in various fields such as optical communications and optical disk drives. For example, a light repeater employs a light emitting element such as a semiconductor laser diode in order to convert an electric signal to a light signal. A light emitting element driving circuit functions to drive the light emitting element. When the light emitting element is formed of a semiconductor laser diode, the light emitting element driving circuit (that is, the semiconductor laser diode driving circuit) supplies the laser diode to a pulse (driving) current corresponding to a signal to be transmitted and a bias current which defines the threshold level of the laser diode. Conventionally, a negative power supply is used to drive the light emitting element so that a current is drawn from the light emitting element to the negative power supply. Recently, there has been a trend to use a positive power supply in which a current is supplied to the light emitting element from the positive power supply. Generally, use of such a positive power supply increases the operating speed.

2. Description of the Related Art

FIG. 1 is a diagram of a conventional light emitting element driving circuit, which employs a negative power supply to which the current is drawn from the light emitting element. A light emitting element 13 has an anode connected to ground (GND), and a cathode connected to a light emitting element driving circuit 11. A constant-current source 12 has a first terminal connected to the driving circuit 11, and a second terminal connected to a negative power supply VSS. An input signal DATA is applied to the driving circuit 11, which turns ON and OFF the light emitting element 13. The driving circuit 11 draws the current from the light emitting element 13 to the negative power supply VSS. The current drawn from the light emitting element 13 includes a pulse current Ip and a bias current Ib.

FIG. 2 is a diagram of another arrangement of the light emitting element driving circuit 11 shown in FIG. 1. The cathode of the light emitting element 11 is connected to the negative power supply VSS, and the anode thereof is connected to the light emitting element driving circuit 11. The light emitting element shown in FIG. 2 includes a PNP transistor 14 and a resistor R. The emitter of the transistor 14 is coupled to the ground GND via the resistor R, and the collector thereof is connected to the anode of the light emitting element 13. The input signal DATA is applied to the base of the transistor 14. The light emitting element driving circuit 11 supplies the current to the light emitting element 13 from the ground. In this regard, the type of the driving circuit 11 shown in FIG. 2 differs from that of the driving circuit 11 shown in FIG. 1.

It should be noted that the circuits shown in FIGS. 1 and 2 are designed taking into consideration use of the negative power supply VSS. However, it may be considered that a positive power supply VCC is replaced by the ground GND as shown in parentheses shown in FIGS. 1 and 2, and the ground GND is replaced by the negative power supply VSS as shown in parentheses.

However, the above arrangement using the positive power supply VCC will have the following problems. In the circuit shown in FIG. 1, the driving circuit 11 functions to draw the current from the light emitting element 13 connected to the positive power supply VCC. In this case, neither the cathode of the light emitting element 13 nor the anode thereof is connected to the ground GND, and thus the light emitting element 13 is in a floating state. Hence, it is liable to be affected by noise such as power supply noise, so that the circuit shown in FIG. 1 does not have a good reliability of the operation thereof.

The circuit shown in FIG. 2 requires the PNP transistor 14, which operates slowly, as compared with an NPN transistor.

SUMMARY OF THE INVENTION

It is a general object of the present invention to provide a light emitting element driving circuit and a light emitting device using the same in which the above disadvantages are eliminated.

A more specific object of the present invention is to provide a light emitting element driving circuit and a light emitting device using the same in which the driving circuit can operate at a high speed with a positive power supply without being affected by noise.

The above objects of the present invention are achieved by a light emitting element driving circuit which drives a light emitting element, the circuit comprising: a drive transistor (33) coupled to a power supply voltage (VCC) and provided on a side of an anode of the light emitting element, the drive transistor receiving an input signal and supplying the light emitting element with a pulse current (Ip) and a bias current (Ib). A cathode of the light emitting element is connected to a lower potential (GND) than the power supply voltage.

The light emitting element driving circuit may be configured so that the drive transistor is included in a logic circuit (34) which performs a predetermined signal process on the input signal.

The light emitting element driving circuit may further comprise a current adjusting circuit (35, 36, 37, 38, 39, 41) coupled to the light emitting element and provided separately from a resistance element coupled between the drive transistor and the light emitting element, the current adjusting circuit adjusting at least one of the pulse current and the bias current.

The light emitting element driving circuit may further comprise a level shift circuit (35) connected in series to a resistance element coupled between the drive transistor and the light emitting element, the level shift circuit adjusting the bias current.

The light emitting element driving circuit may further comprise a constant-current source (36) connected to the light emitting element, the constant-current source supplying the light emitting element with the bias current, so that a magnitude of the pulse current can be determined by a resistance element coupled between the drive transistor and the light emitting element.

The light emitting element driving circuit may further comprise a control circuit (37, 38, 39, 41) which controls an input amplitude of the drive transistor so that the pulse current can be adjusted by changing the input amplitude.

The light emitting element driving circuit may be configured so that the control circuit comprises an attenuator (37) which attenuates an output amplitude of a logic circuit performing a predetermined signal process on the input signal so that the input amplitude of the drive transistor can be controlled by the attenuator.

The light emitting element driving circuit may be configured so that the control circuit comprises a voltage dividing circuit (38) which attenuates an output amplitude of a logic circuit performing a predetermined signal process on the input signal so that the input amplitude of the drive transistor can be controlled by the voltage dividing circuit.

The light emitting element driving circuit may be configured so that the control circuit comprises a differential amplifier circuit (39) which differentially amplifies an output amplitude of a logic circuit performing a predetermined signal process on the input signal so that the input amplitude of the drive transistor can be controlled by an output signal of the differential amplifier circuit.

The light emitting element driving circuit may further comprise a compensating circuit (40) which maintains the bias voltage defined by the control circuit at a given level irrespective of a variation in the power supply voltage.

The light emitting element driving circuit may be configured so that it further comprises a constant-voltage source (41) connected in series to the voltage dividing circuit, the constant-voltage source functioning to adjust the bias voltage output by the voltage dividing circuit.

The light emitting element driving circuit may be configured so that the voltage dividing circuit comprises resistors (R4, R5) including a variable resistor.

The light emitting element driving circuit may be configured so that the drive transistor is an NPN transistor.

The light emitting element driving circuit may be configured so that the power supply voltage is a positive power supply voltage and the lower potential is a ground level.

The above objects of the present invention are also achieved by a light emitting device comprising: a light emitting element (31); an input terminal (52) receiving an input signal (DATA); a light emitting element driving circuit (51) driving the light emitting element; and an output part (55) which outputs a light emitted from the light emitting element to an outside of the light emitting device. The light emitting element driving circuit is configured as described above.

It is a further object of the present invention to provide an optical transmitter including a light emitting element driving circuit as described above.

This object of the present invention is achieved by an optical transmitter, comprising a light emitting element; and a driving circuit for driving the light emitting element, the driving circuit including: a drive transistor coupled to a power supply voltage and provided on a side of an anode of the light emitting element, the drive transistor receiving an input signal and supplying the light emitting element with a pulse current and a bias current; and a cathode of the light emitting element being connected to a lower potential than the power supply voltage.

BRIEF DESCRIPTION OF THE DRAWINGS

Other objects, features and advantages of the present invention will become more apparent from the following detailed description when read in conjunction with the accompanying drawings in which.

DETAILED DESCRIPTION

Figure 1:
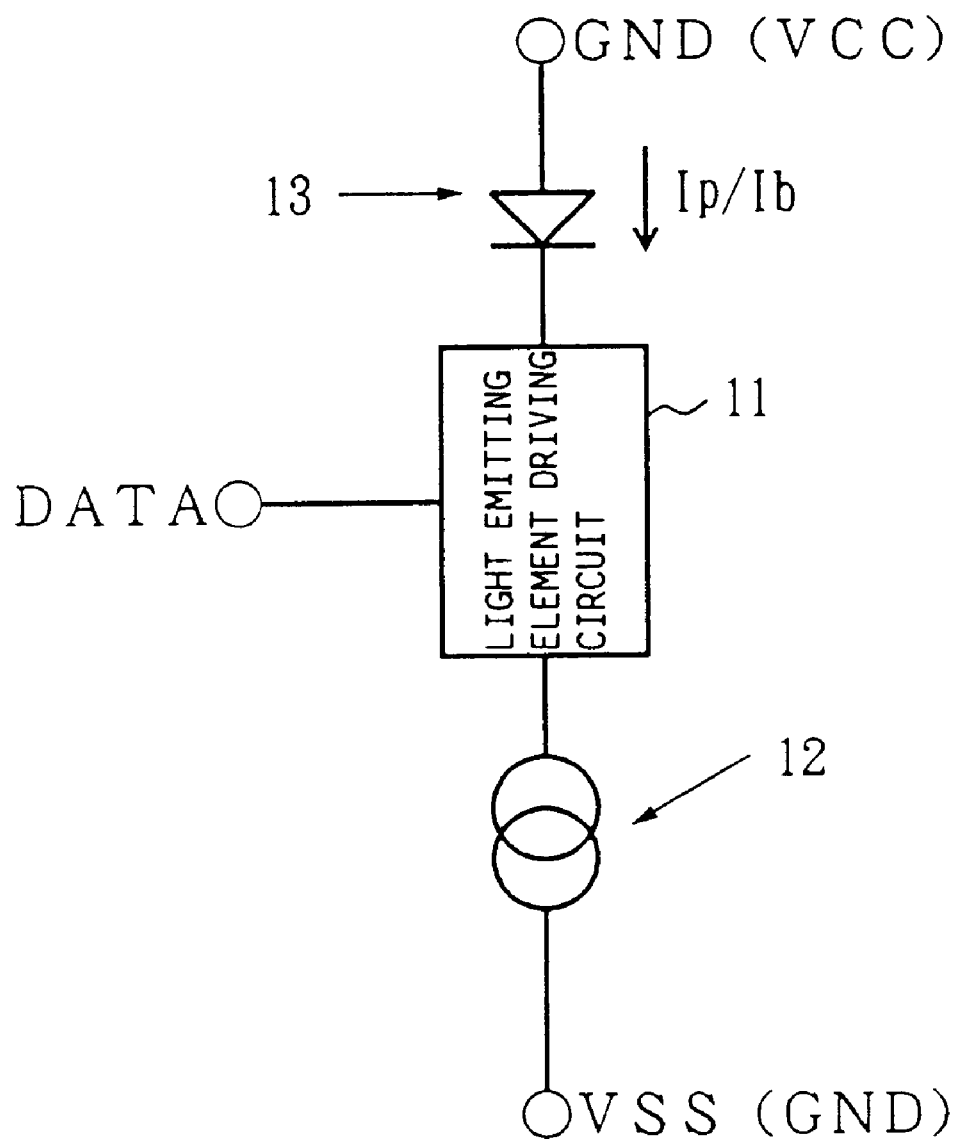
FIG. 1 is a circuit diagram of a conventional light emitting element driving circuit.
Figure 2:
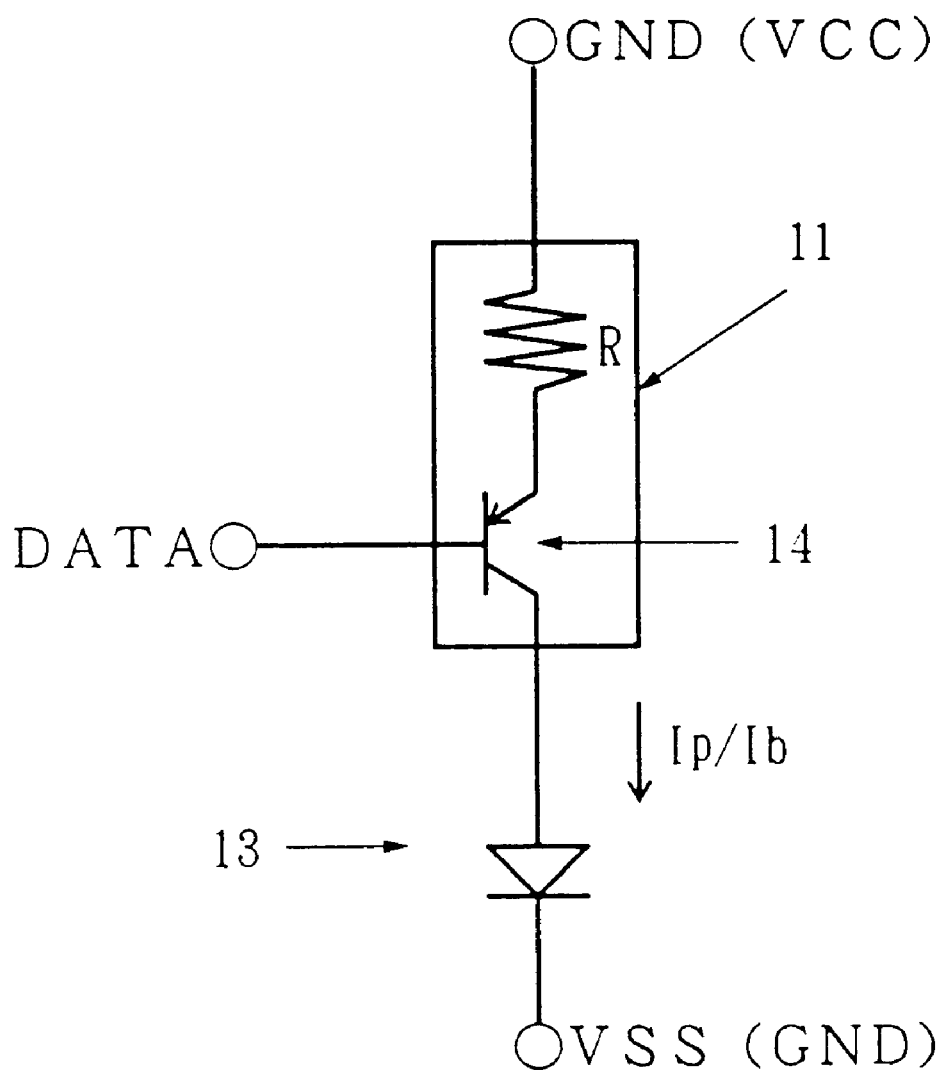
FIG. 2 is a circuit diagram of another conventional light emitting element driving circuit.
Figure 3:
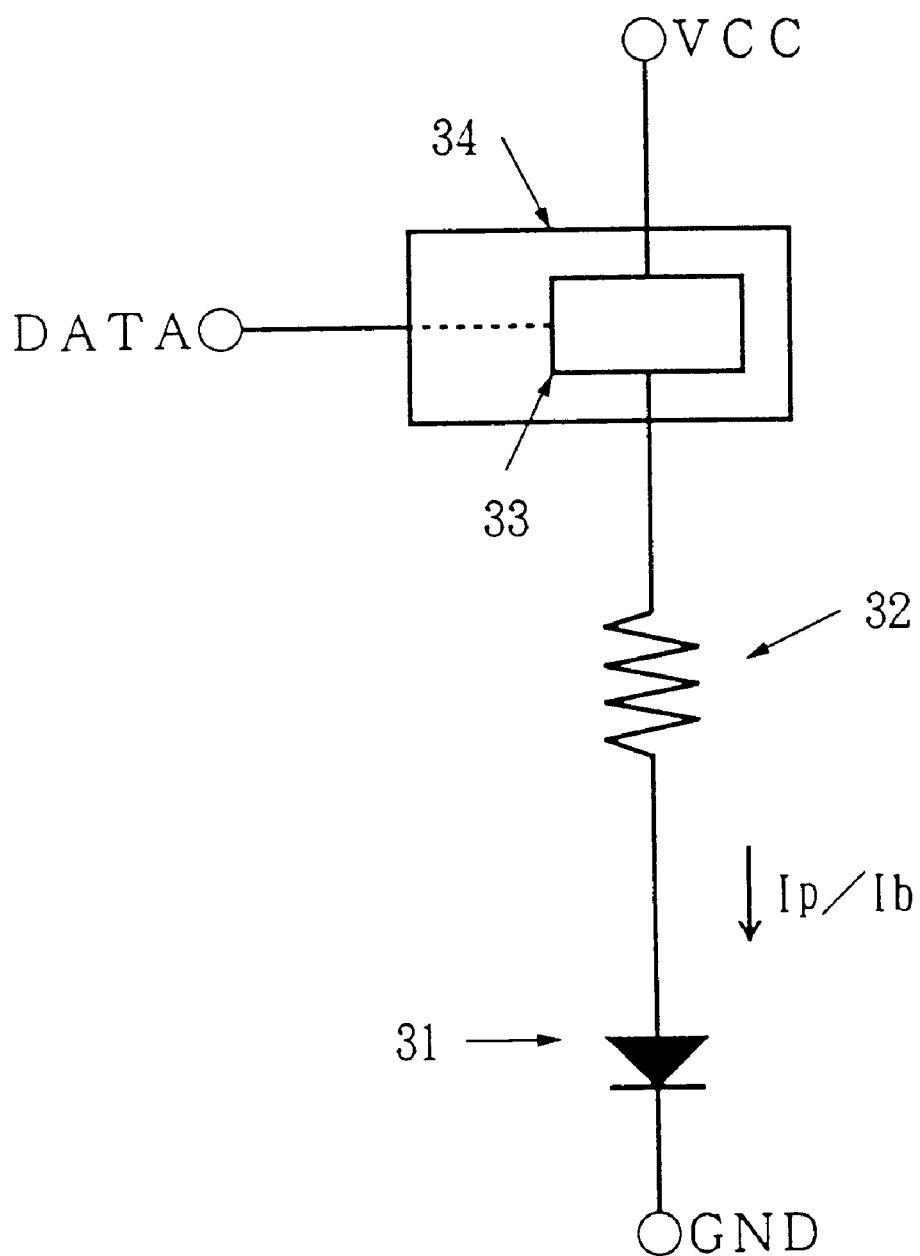
FIG. 3 is a circuit diagram of a light emitting element driving circuit according to a first embodiment of the present invention.

FIG. 3 is a diagram of an outline of a light emitting element driving circuit according to a first embodiment of the present invention. The light emitting element driving circuit according to the first embodiment of the present invention drives a light emitting element 31, and includes a resistor 32 and a drive transistor 33. The light emitting element 31 is, for example, a semiconductor laser diode which emits a laser beam having a wavelength of 780 nm. The drive transistor 33 is a transistor used in an output stage (output buffer) of a logic circuit 34, and is an NPN bipolar transistor or an N-channel field effect transistor such as an N-channel MOS transistor. The drive transistor 33 is connected to a positive power supply VCC. The logic circuit 33 performs a predetermined signal process on an input signal DATA, such as a waveform shaping process, an encoding process and/or a multiplexing process. It should be noted that the drive transistor 33 which drives the light emitting element 31 (that is, supplies a pulse current Ip and a bias current Ib to the light emitting element 31) is a transistor used to form the output stage (output buffer) of the logic circuit 34. In other words, the logic circuit 34 directly drives the light emitting element 31, so that the light emitting element driving circuit can be configured simply.

The output of the logic circuit 34 is terminated by the resistor 32. As will be described later, it is possible to supply the pulse current Ip and the bias current Ib via the resistor 32. The anode of the light emitting element 31 is connected to one end of the resistor 32, and the cathode thereof is grounded (GND). Since the cathode of the light emitting element 31 is grounded, it is possible to avoid the floating state thereof and prevent the element 31 from being affected by noise such as power supply noise.

A description will now be given of the function of the resistor 32.

The pulse current Ip and the bias current Ib can be expressed as follows:

$$Ib=(VCC-V_{out(L)}-\phi_{LD})/RLD \qquad (1)$$

$$Ip=(VCC-V_{out(H)}-\phi_{LD})/RLD-Ib \qquad (2)$$

where VCC denotes the positive power supply voltage, $V_{out(H)}$ denotes the high-level output of the logic circuit 34, $V_{out(L)}$ denotes the low-level output of the logic circuit 34, $\phi_{LD}$ denotes a built-in voltage of the light emitting element 31, and RLD is the value of the resistance of the resistor 32 used to define the amounts of the pulse current Ip and bias current Ib.

For example, when VCC=5 V and Ib=30 mA in a state in which the logic circuit 34 is a P-channel ECL logic circuit, the low-level output level of the logic circuit 34 is approximately equal to 3.3 V. Hence, the resistance value RLD of the resistor 32 is equal to 75 Ω. Hence, the pulse current Ip is equal to 11 mA. Since the P-ECL logic circuit 34 generally has an amplitude equal to 0.8 V to 1.0 V, when either the pulse current Ip or the bias current Ib is determined, the other is automatically determined.

The low-level output of the logic circuit 34 is determined in the structure shown in FIG. 3, and thus the bias current Ib falls within a limited range. If the resistance value RLD of the resistor 32 is defined by the bias current Ib, the pulse current Ip falls within a limited range because the output amplitude of the logic circuit 34 is approximately fixed. As described below, a circuit is provided which is designed taking into consideration the above and is capable of adjusting at least one of the pulse current Ip and the bias current Ib.

Figure 4:
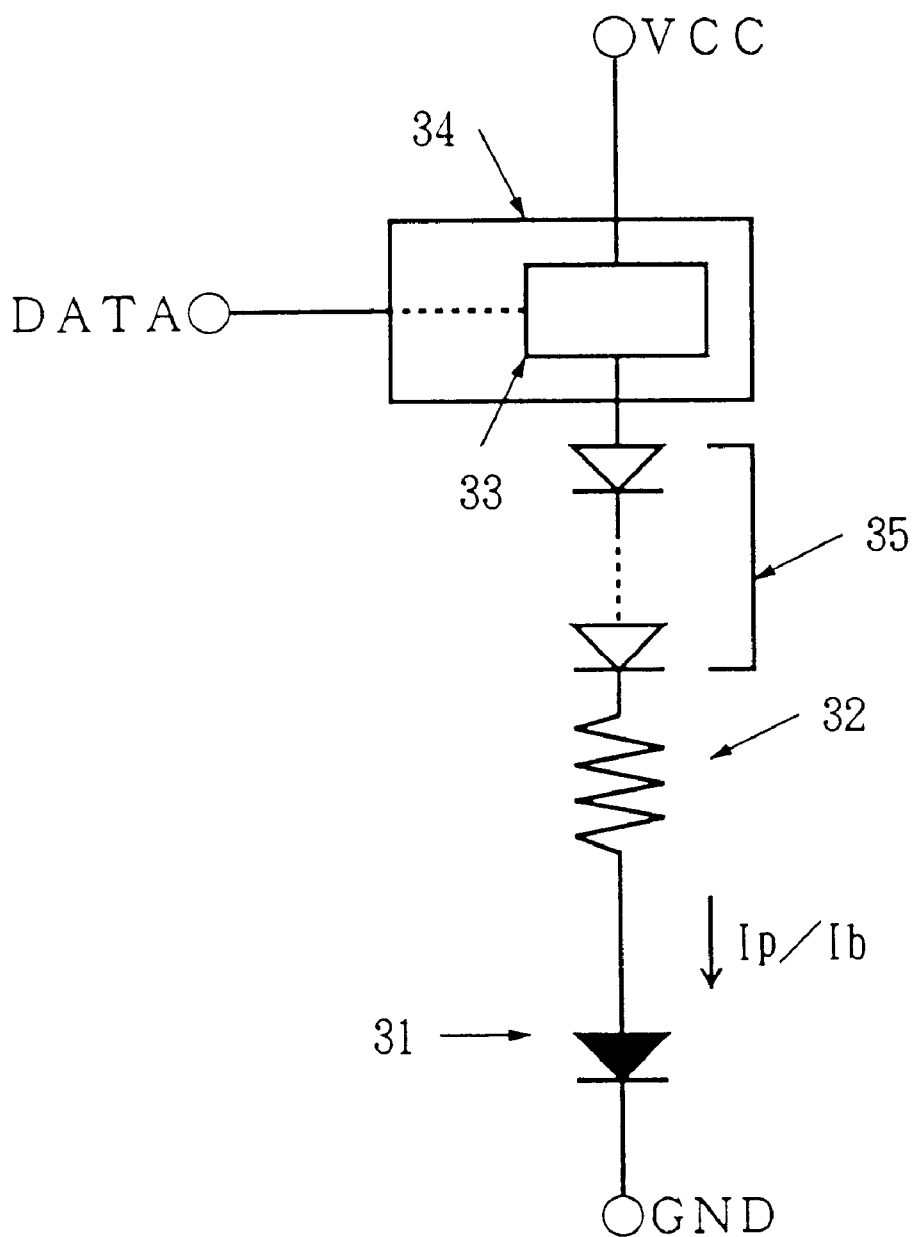
FIG. 4 is a circuit diagram of a light emitting element driving circuit according to a second embodiment of the present invention.

FIG. 4 is a diagram of a light emitting element driving circuit according to a second embodiment of the present invention. In FIG. 4, parts that are the same as those shown in FIG. 3 are given the same reference numbers. The circuit shown in FIG. 4 is designed taking into consideration a case encountered in the circuit shown in FIG. 3 where it is very difficult to set the bias current Ib to a very low level because the low-level output of the logic circuit 34 is fixed to the given value. As shown in FIG. 4, a level shift circuit including at least one diode 35 is connected in series to the resistor 32 in order to reduce the potential of the end of the resistor 32 connected to the logic circuit 34 and thus make it possible to set the bias current Ib to a low level. The bias current Ib thus obtained can be expressed as follows:

$$Ib=(VCC-V_{out(L)}-n\times\phi_B-\phi_{LD})/RLD \qquad (3)$$

where n denotes the number of stages of diodes 35 connected in series, and $\phi_B$ denotes the built-in voltage of one diode 35. It is possible to carry out non-bias modulation if the number of stages of diodes 35 satisfies $(VCC-V_{out(L)}-n\times\phi_B<\phi_{ld})$.

Figure 5:
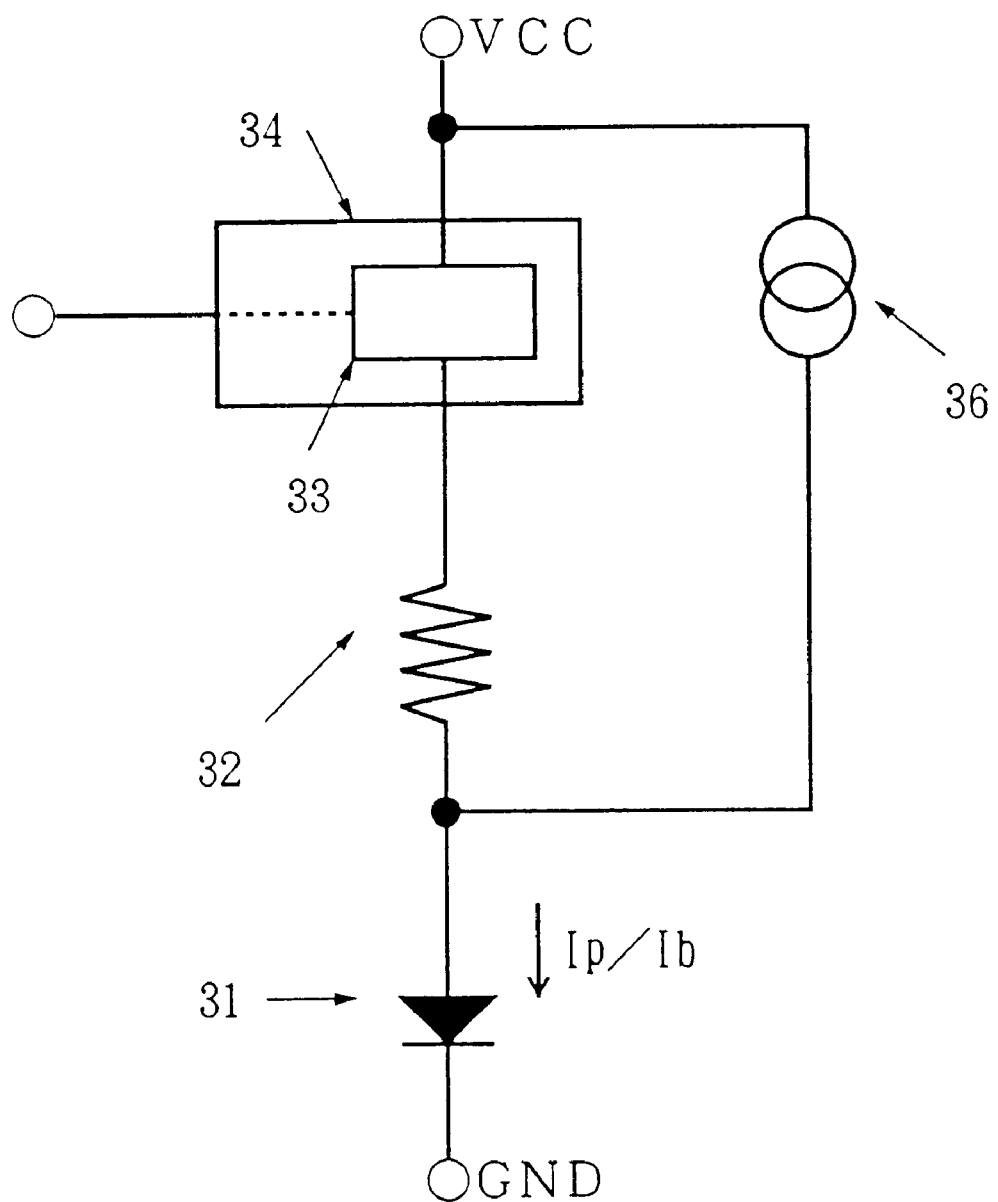
FIG. 5 is a circuit diagram of a light emitting element driving circuit according to a third embodiment of the present invention.

FIG. 5 is a diagram of a light emitting element driving circuit according to a third embodiment of the present invention. In FIG. 5, parts that are the same as those shown in the previously described figures are given the same reference numbers. The circuit shown in FIG. 5 is designed taking into consideration a case encountered in the circuit shown in FIG. 3 where there is a difficulty to obtain a given large value of the bias current Ib by the resistor 32 in which the bias current Ib flows from the positive power supply VCC. As shown in FIG. 5, a constant-current source 36 is connected between the positive power supply VCC and the anode of the light emitting element 31.

The constant-current source 36 contributes to supplying a large part of the given value of the bias current Ib. If it is attempted to supply a large amount of the bias current Ib only by the resistor 32, the anode potential of the light emitting element 31 is reduced, and the given high-level output may not be obtained. On the other hand, by providing the constant-current source 36, it is possible to prevent a voltage drop developing across the resistor 32 and to supply the given pulse current Ip and bias current Ib. It is possible to employ the constant-current source 36 which has a temperature variation compensating function. In this case, the constant-current source 36 can compensate for a variation in the amounts of the currents Ib and Ip due to a temperature variation.

It should be noted that the pulse current Ip in the circuit shown in FIG. 3 can be expressed as follows by using equations (1) and (2):

$$Ip=(V_{out(H)}-V_{out(L)})/RLD \qquad (4)$$

If the resistance value RLD of the resistor 32 is determined by the value of the bias current Ib in the circuit shown in FIG. 3, the pulse current Ip defined by equation (4) falls in a limited range because the output amplitude of the logic circuit 34 ($V_{out(H)}-V_{out(L)}$) is constant. The following embodiments of the present invention are designed to flexibly set the pulse current Ip to a given value separately from setting of the bias current Ib.

Figure 6:
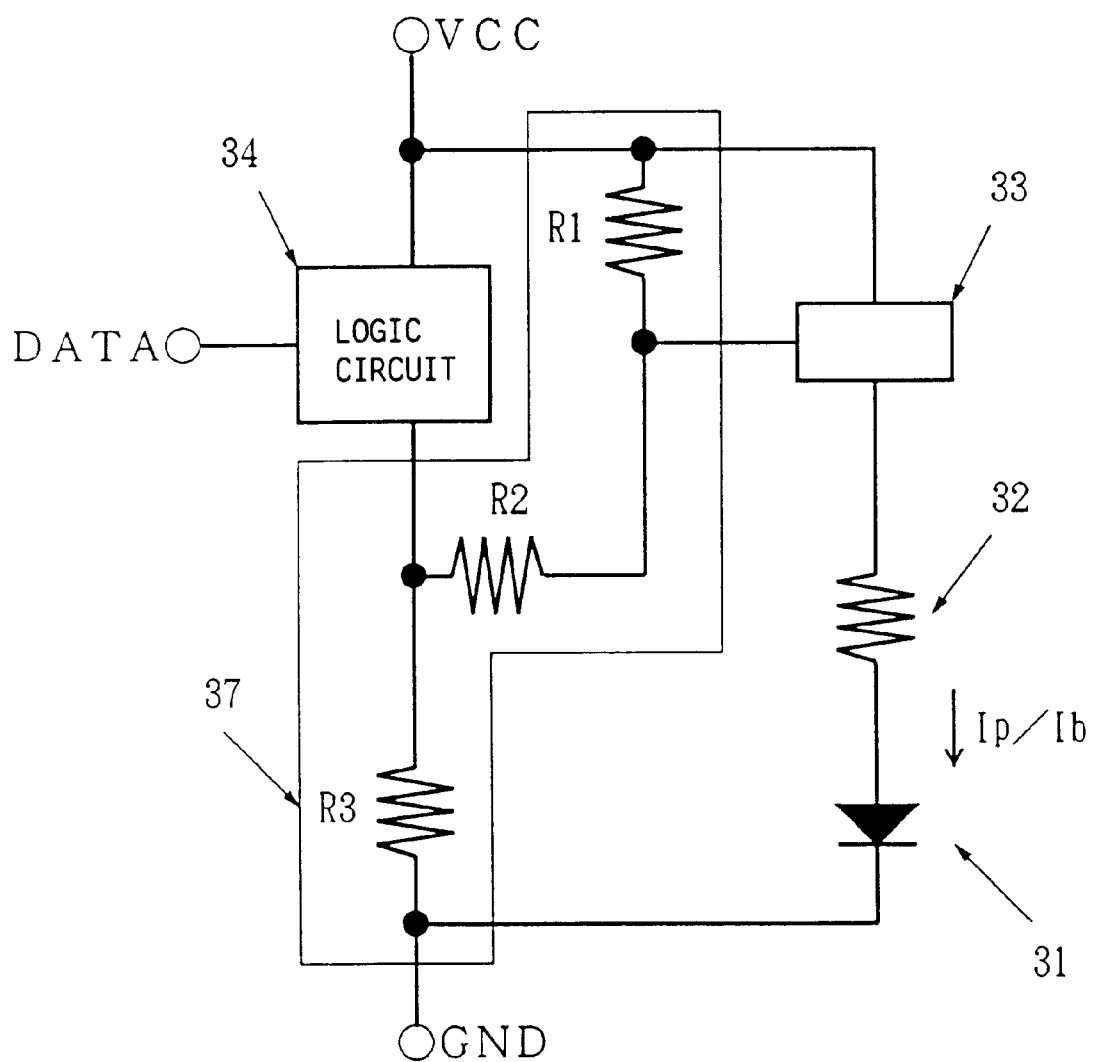
FIG. 6 is a circuit diagram of a light emitting element driving circuit according to a fourth embodiment of the present invention.

FIG. 6 is a circuit diagram of a light emitting element driving circuit according to a fourth embodiment of the present invention. In FIG. 6, parts that are the same as those shown in the previously described figures are given the same reference numbers. A π-type resistor attenuator 37 functions to reduce (attenuate) the output amplitude ($V_{out(H)}-V_{out(L)}$) of the logic circuit 34 and reduce the pulse current Ip. When the output amplitude of the logic circuit 34 is reduced, the input amplitude of the drive transistor 33 can be reduced and thus the pulse current Ip can be reduced. The π-type resistor attenuator 37 includes three resistors R1, R2 and R3. A connection node between the resistors R1 and R2 is connected to a control terminal of the drive transistor 33 (which corresponds to the base or gate thereof), and a connection node between the resistors R2 and R3 is connected to the output terminal of the logic circuit 34. The other end of the resistor R1 is connected to the positive power supply VCC, and the other end of the resistor R3 is connected to the ground GND.

It should be noted that the drive transistor 33 is provided separately from the logic circuit 34 in order to reduce the output amplitude of the logic circuit 34. When at least one of the resistors R1, R2 and R3 is formed of a variable resistor, the output amplitude of the logic circuit 34, that is, the pulse current Ip can be adjusted.

Figure 7:
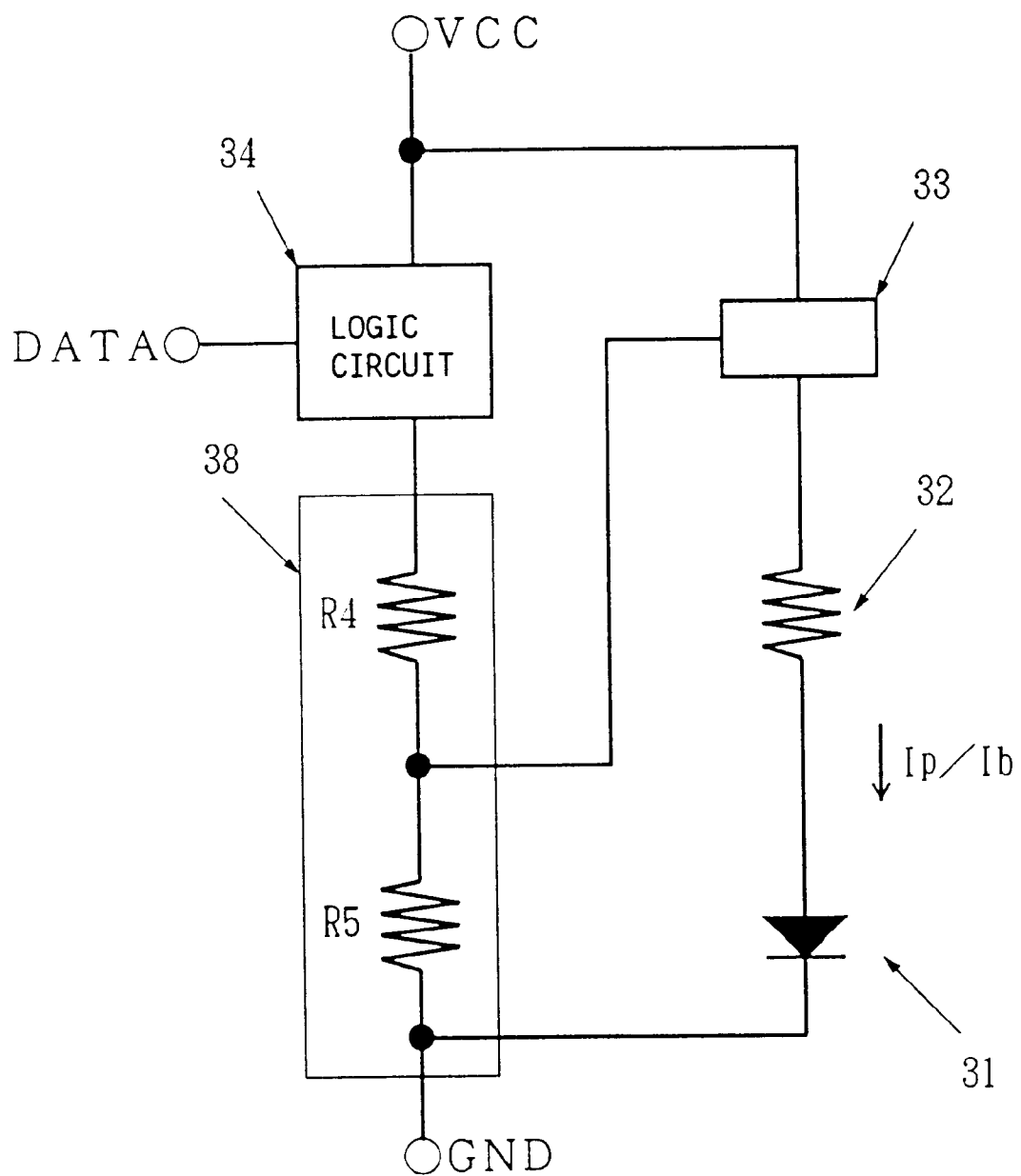
FIG. 7 is a circuit diagram of a light emitting element driving circuit according to a fifth embodiment of the present invention.

FIG. 7 is a circuit diagram of a light emitting element driving circuit according to a fifth embodiment of the present invention. In FIG. 7, parts that are the same as those shown in the previously described figures are given the same reference numbers. A voltage dividing circuit 38 is employed which divides the output voltage of the logic circuit 34 by means of resistors connected in series and supplies a divided voltage to the drive transistor 33. The divided voltage corresponds to a reduction in the output amplitude ($V_{out(H)} - V_{out(L)}$) of the logic circuit 34, and contributes to reducing the pulse current Ip. The voltage dividing circuit 38 shown in FIG. 7 consists of two resistors R4 and R5, and a connection node therebetween is connected to the control terminal of the drive transistor 33. It is possible to form one of the resistors R4 and R5 of a variable resistor and thus adjust the output amplitude of the logic circuit 34 and the pulse current Ip.

Figure 8:
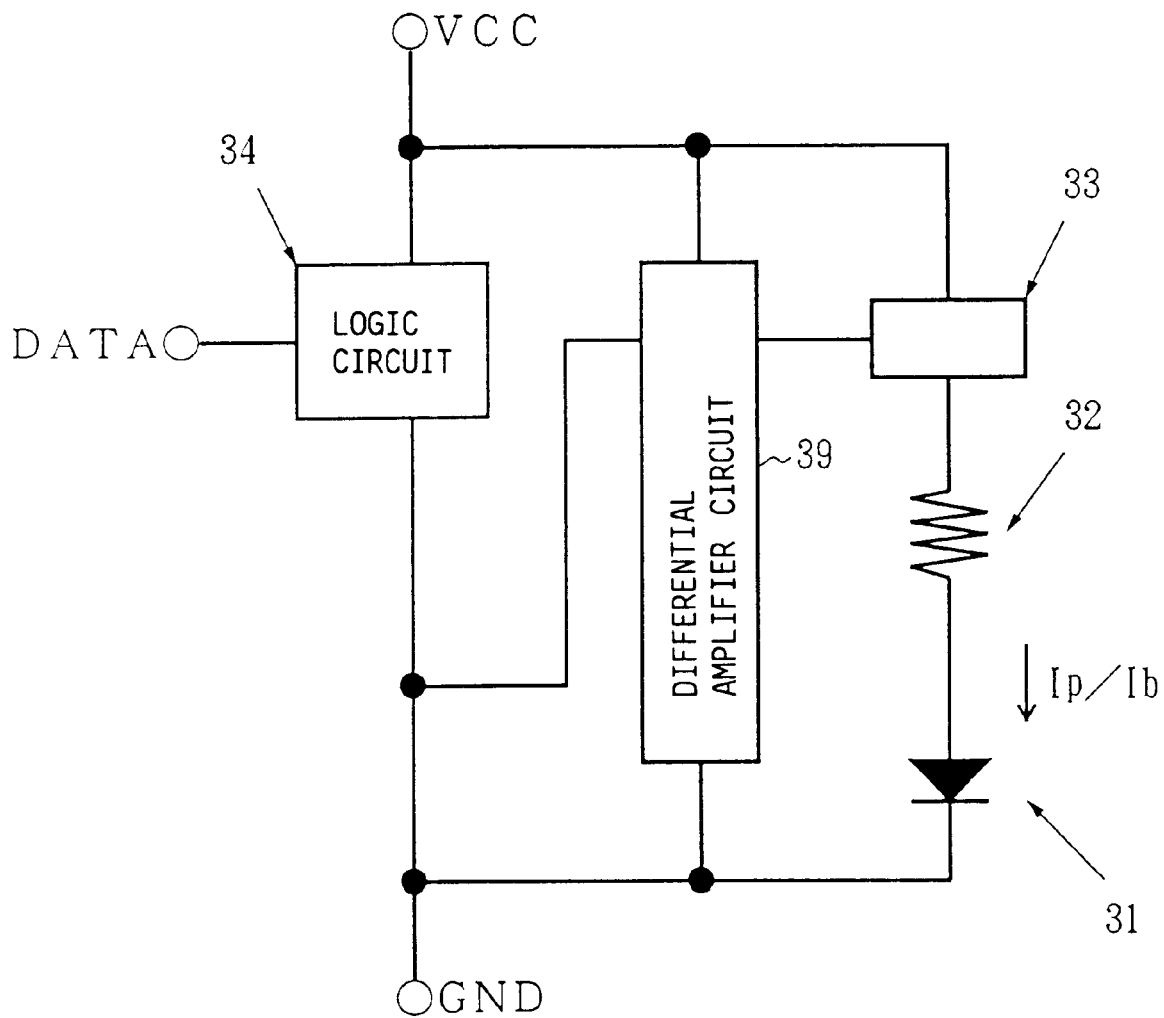
FIG. 8 is a circuit diagram of a light emitting element driving circuit according to a sixth embodiment of the present invention.

FIG. 8 is a circuit diagram of a light emitting element driving circuit according to a sixth embodiment of the present invention. In FIG. 8, parts that are the same as those shown in the previously described figures are given the same reference numbers. A differential amplifier circuit 39 is provided between the positive power supply VCC and the ground GND. The differential amplifier circuit 39 receives the output voltage of the logic circuit 34 and supplies a differential amplification output to the drive transistor 33. The differential amplification output corresponds to a reduction in the output amplitude ($V_{out(H)} - V_{out(L)}$) of the logic circuit 34 and contributes to reducing the pulse current Ip, as in the case shown in FIG. 6 or FIG. 7. An example of the circuit of the differential amplifier circuit 39 will be described later.

Figure 9:
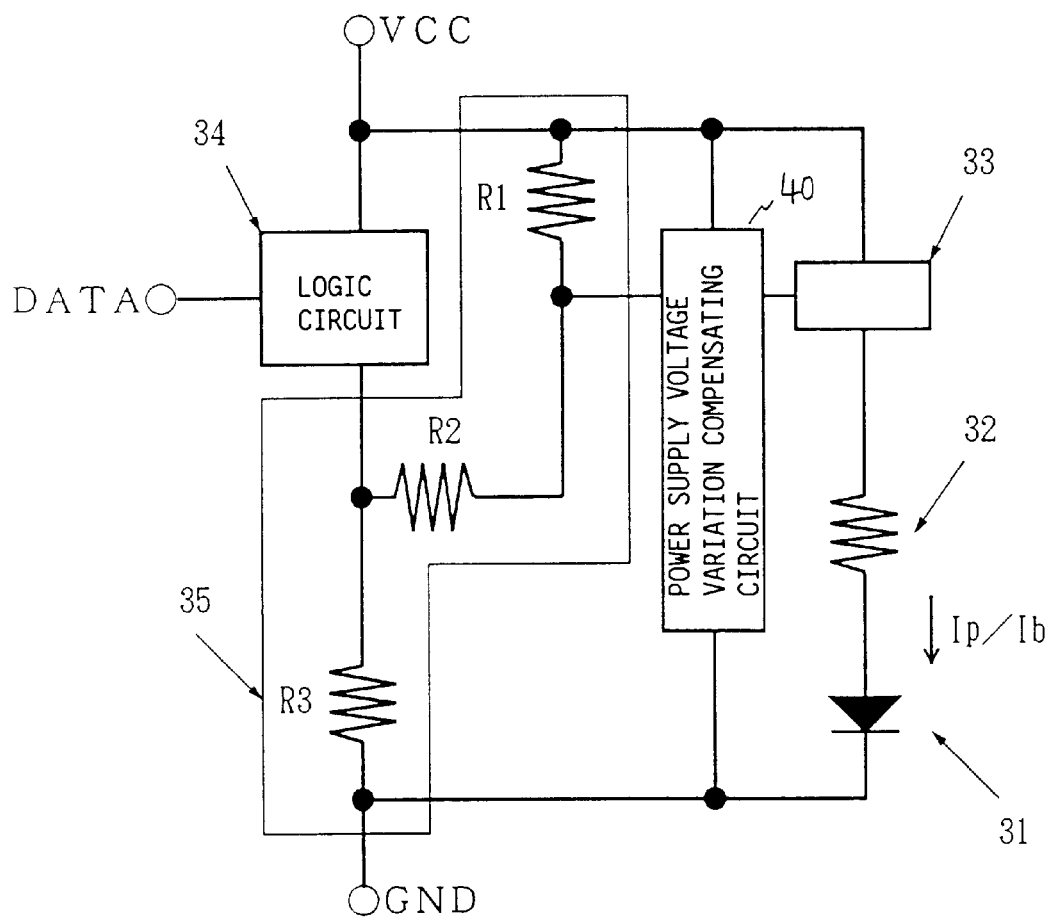
FIG. 9 is a circuit diagram of a light emitting element driving circuit according to a seventh embodiment of the present invention.

FIG. 9 is a circuit diagram of a light emitting element driving circuit according to a seventh embodiment of the present invention. In FIG. 9, parts that are the same as shown in the previously described figures are given the same reference numbers. The circuit shown in FIG. 9 is obtained by providing a power supply voltage variation compensating circuit 40 to the circuit shown in FIG. 6. The output voltage of the π-type resistor attenuator 37 (the potential of the connection node between the resistors R1 and R2) is subjected to a compensating process in which a variation in the power supply voltage VCC is compensated for. Then, the compensated voltage is supplied, as the bias voltage, to the drive transistor 33 from the compensating circuit 40. In the circuit shown in FIG. 6, if the power supply voltage VCC is varied, the potential of the connection node between the resistors R1 and R2 is varied and the bias current is thus varied. The power supply voltage variation compensating circuit 40 compensates for such a variation in the power supply voltage VCC and maintains the bias voltage applied to the drive transistor 33 at the constant level. An example of the structure of the power supply voltage variation compensating circuit 40 will be described later.

Figure 10:
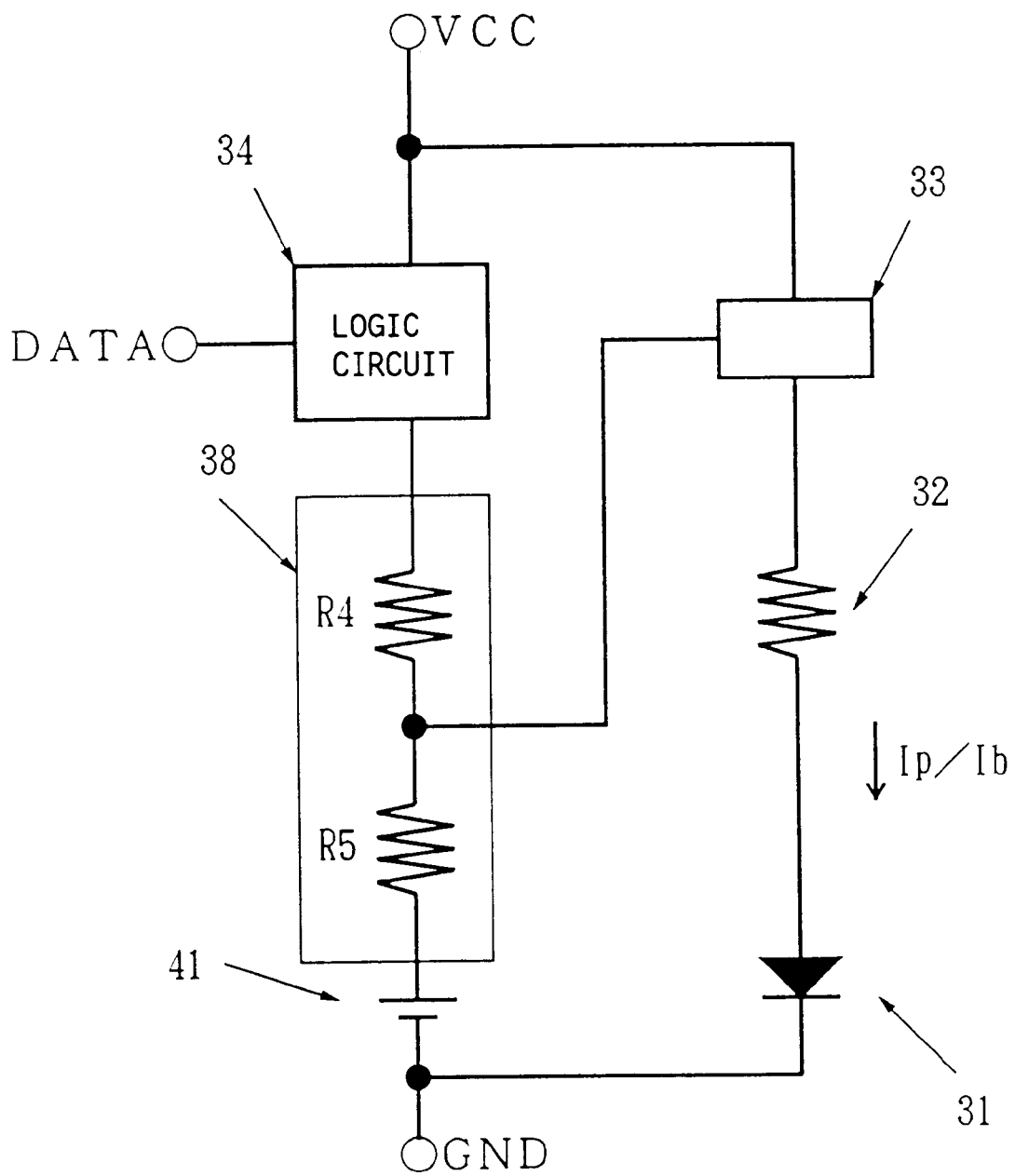
FIG. 10 is a circuit diagram of a light emitting element driving circuit according to an eighth embodiment of the present invention.

FIG. 10 is a circuit diagram of a light emitting element driving circuit according to an eighth embodiment of the present invention. In FIG. 10, parts that are the same as those shown in the previously described figures are given the same reference numbers. A constant-voltage source 41 is provided between the ground GND and the voltage dividing circuit 38 of the circuit shown in FIG. 7. In the circuit shown in FIG. 7, there is a possibility that a certain magnitude of the current flowing in the resistor R4 may decrease the potential of the connection node between the resistors R4 and R5 and a large amount of the bias current Ib may be set. The constant-voltage source 41 functions to increase the potential of the above connection node, that is, the bias voltage applied to the drive transistor 33. Hence, the drive transistor 33 can be driven at a suitable bias voltage, so that the bias current Ib can be set to a given level.

If the constant-voltage source 41 is formed of a variable constant-voltage source, the bias current Ib can be adjusted to the optimal level of the light emitting element 31.

Figure 11:
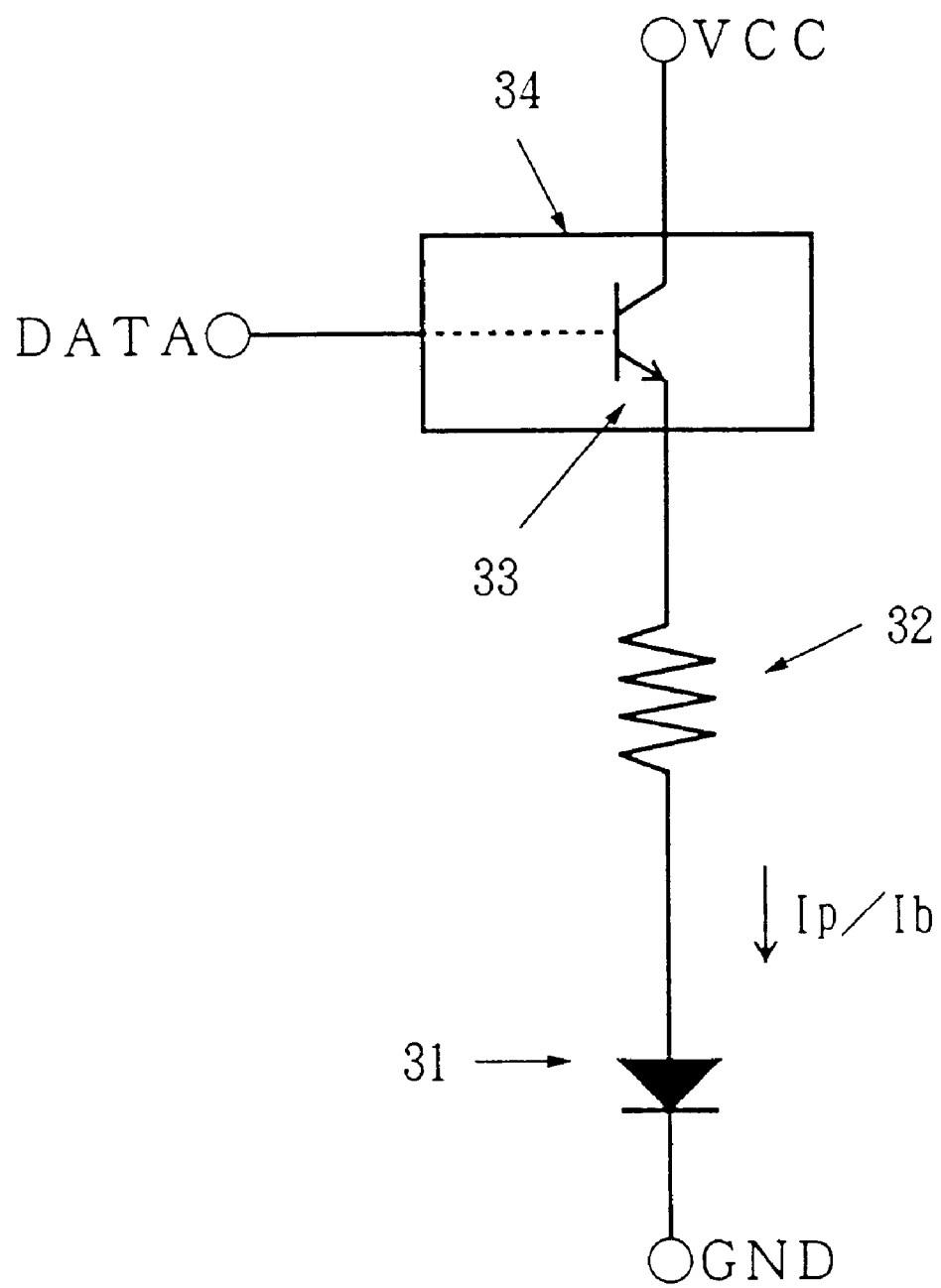
FIG. 11 is a circuit diagram of the detail of the light emitting element driving circuit according to the first embodiment of the present invention.

FIG. 11 shows the detail of the circuit shown in FIG. 3. The logic circuit 34 is, for example, MC100E416 produced by Motorola Inc. The output buffer of the above device is formed of an NPN transistor, which is used to form the drive transistor 33. Since the circuit shown in FIG. 11 has a simple configuration and the NPN transistor can operate at a high speed as compared with the PNP transistor, the light emitting element 31 can be driven at a high speed. Further, there is another advantage in that the circuit shown in FIG. 11 is not liable to be affected by noise irrespective of use of the NPN transistor because the cathode of the light emitting element 31 is grounded.

Figure 12:
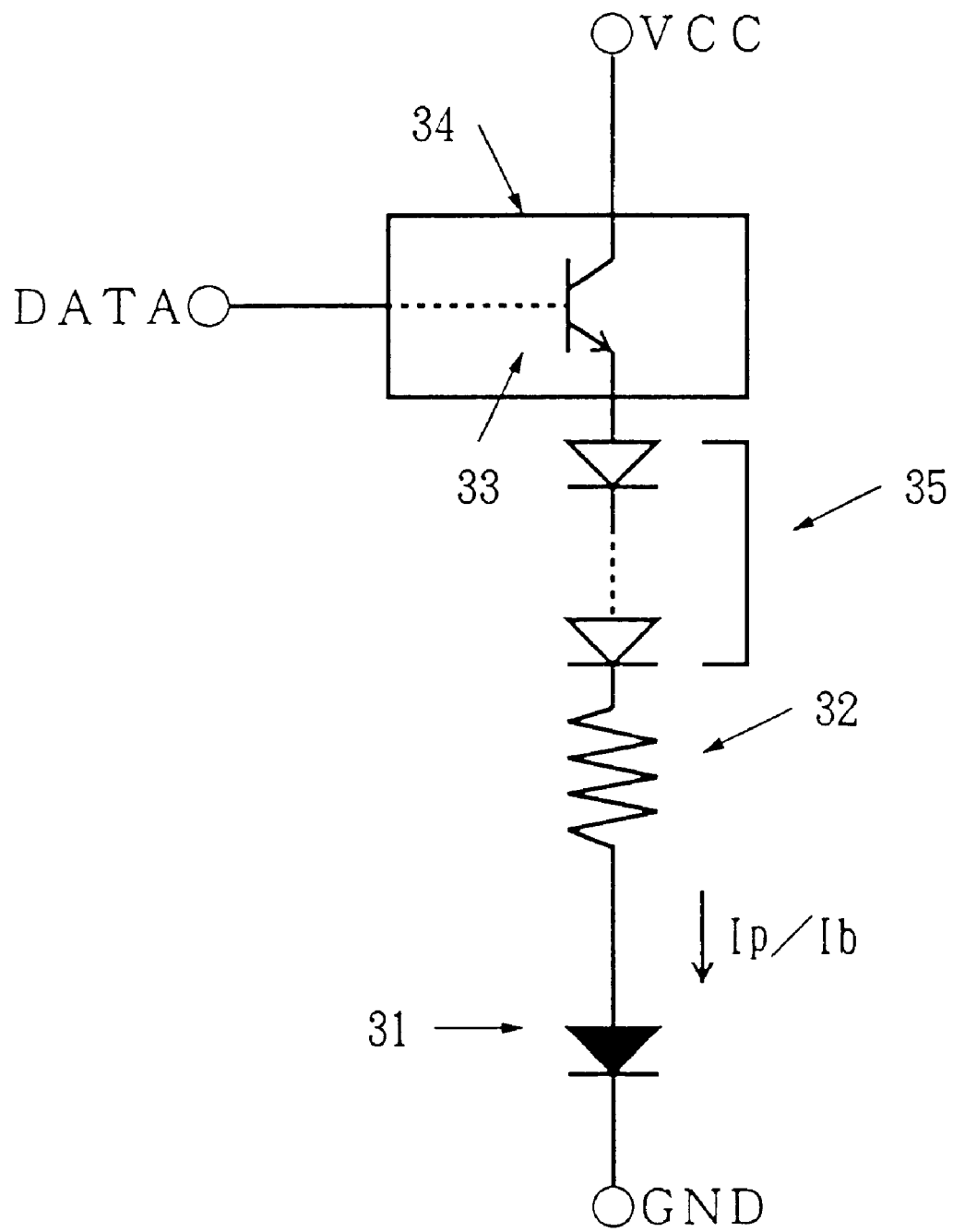
FIG. 12 is a circuit diagram of the detail of the light emitting element driving circuit according to the second embodiment of the present invention.

FIG. 12 shows the detail of the circuit shown in FIG. 4. As in the case shown in FIG. 11, the drive transistor 33 is formed of the NPN transistor which is part of the output buffer of the logic circuit 34.

Figure 13:
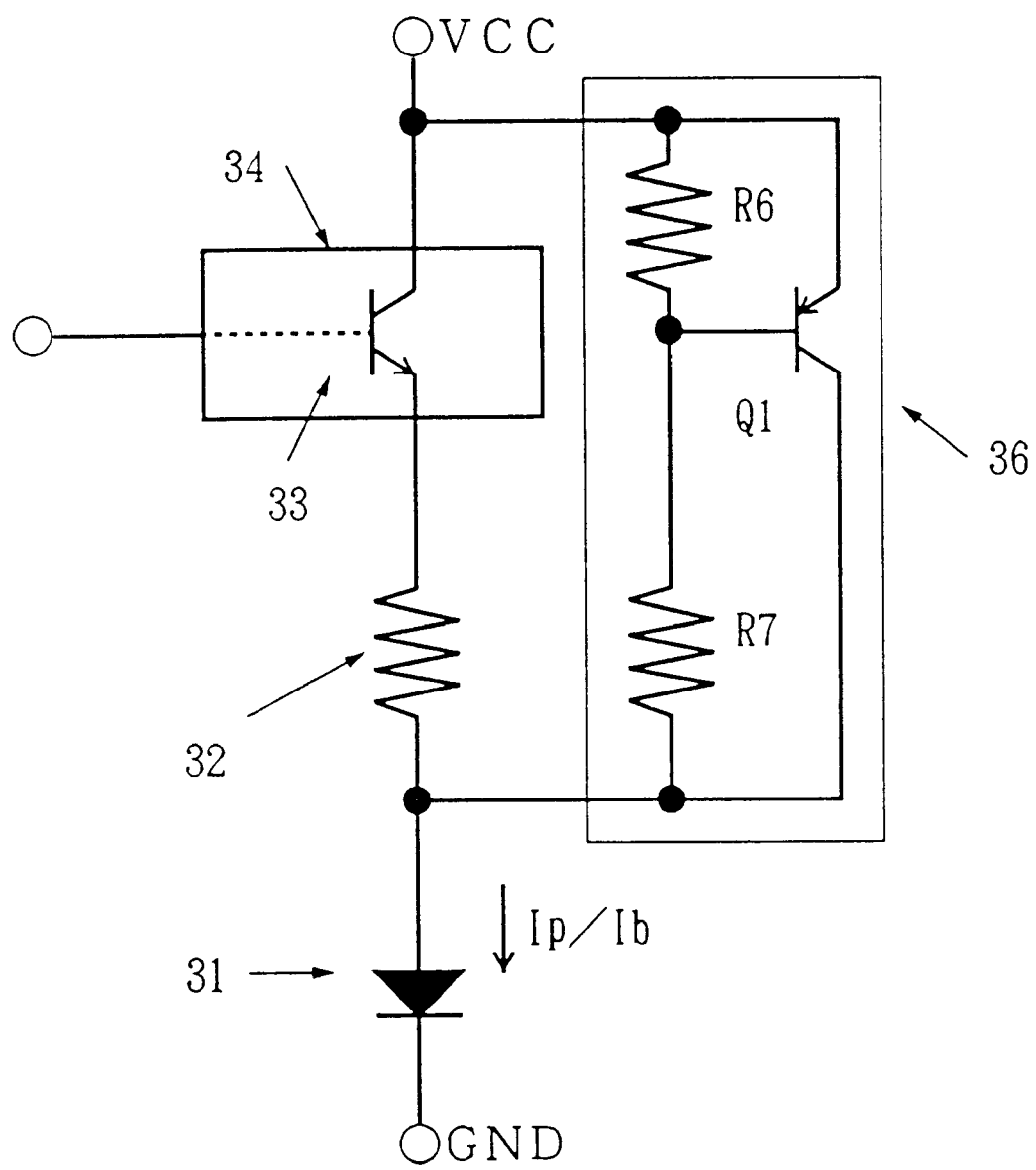
FIG. 13 is a circuit diagram of the detail of the light emitting element driving circuit according to the third embodiment of the present invention.

FIG. 13 shows the detail of the circuit shown in FIG. 5. As in the case shown in FIG. 11, the drive transistor 33 is formed of the NPN transistor in the output buffer of the logic circuit 34. The constant-current source 36 is made up of a PNP transistor Q1 and resistors R6 and R7. The emitter and collector of the transistor Q1 are connected to the positive power supply VCC and the anode of the light emitting element 31, respectively. The resistor R6 is connected between the emitter and base of the transistor Q1. The resistor R7 is connected between the base and collector of the transistor Q1. The resistors R6 and R7 produce the bias voltage for the transistor Q1. The transistor Q1 supplies a constant current to the light emitting element Q1. The above constant current is the bias current Ib of the light emitting element 31.

Figure 14:
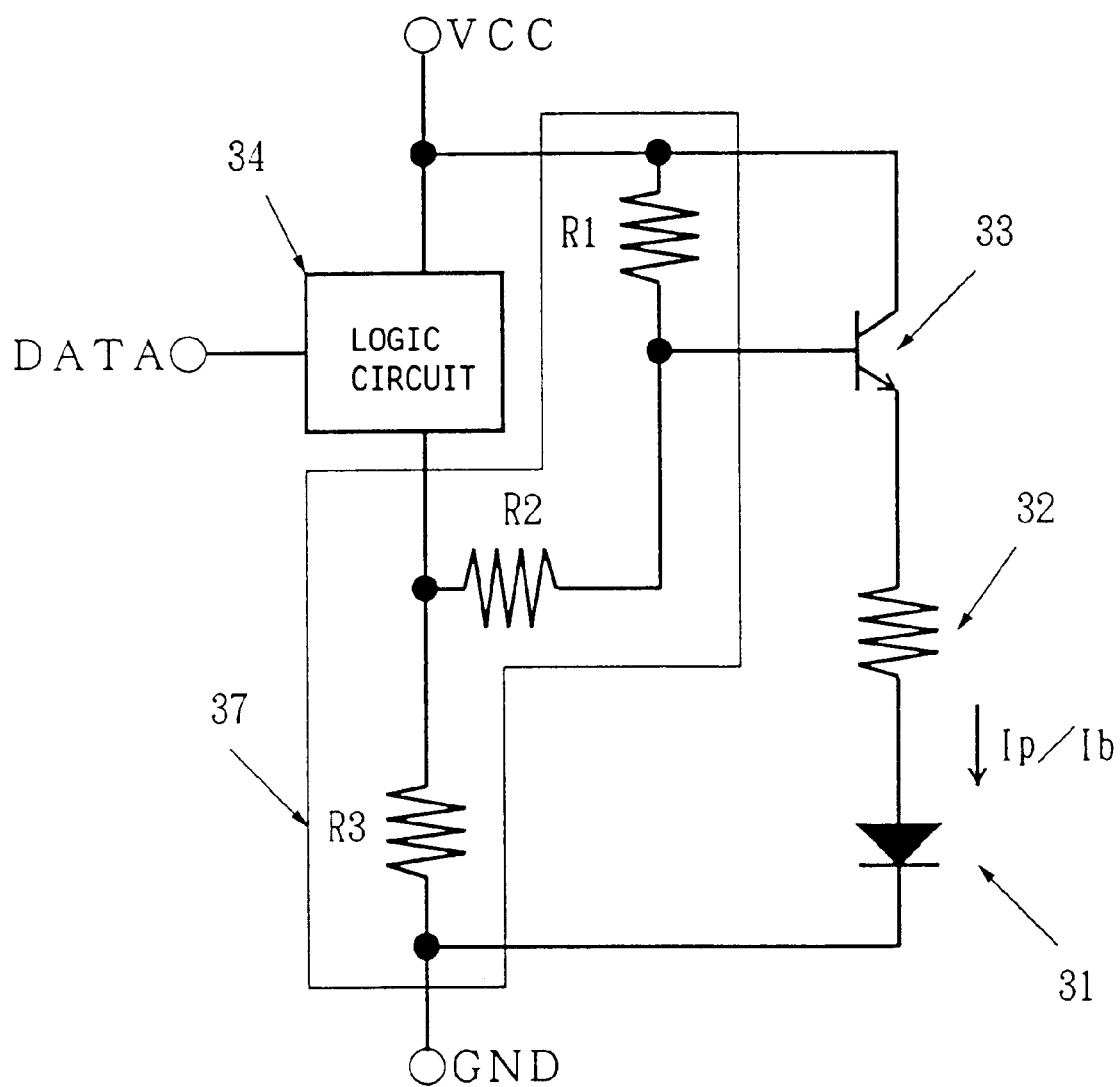
FIG. 14 is a circuit diagram of the detail of the light emitting element driving circuit according to the fourth embodiment of the present invention.

FIG. 14 shows the detail of the circuit shown in FIG. 6. The logic circuit 34 is, for example, MC100E416 produced by Motorola Inc. The drive transistor 33 is formed of an NPN transistor. As has been described previously, the NPN transistor functioning as the drive transistor 33 is provided separately from the transistors of the output buffer of the logic circuit 34.

Figure 15:
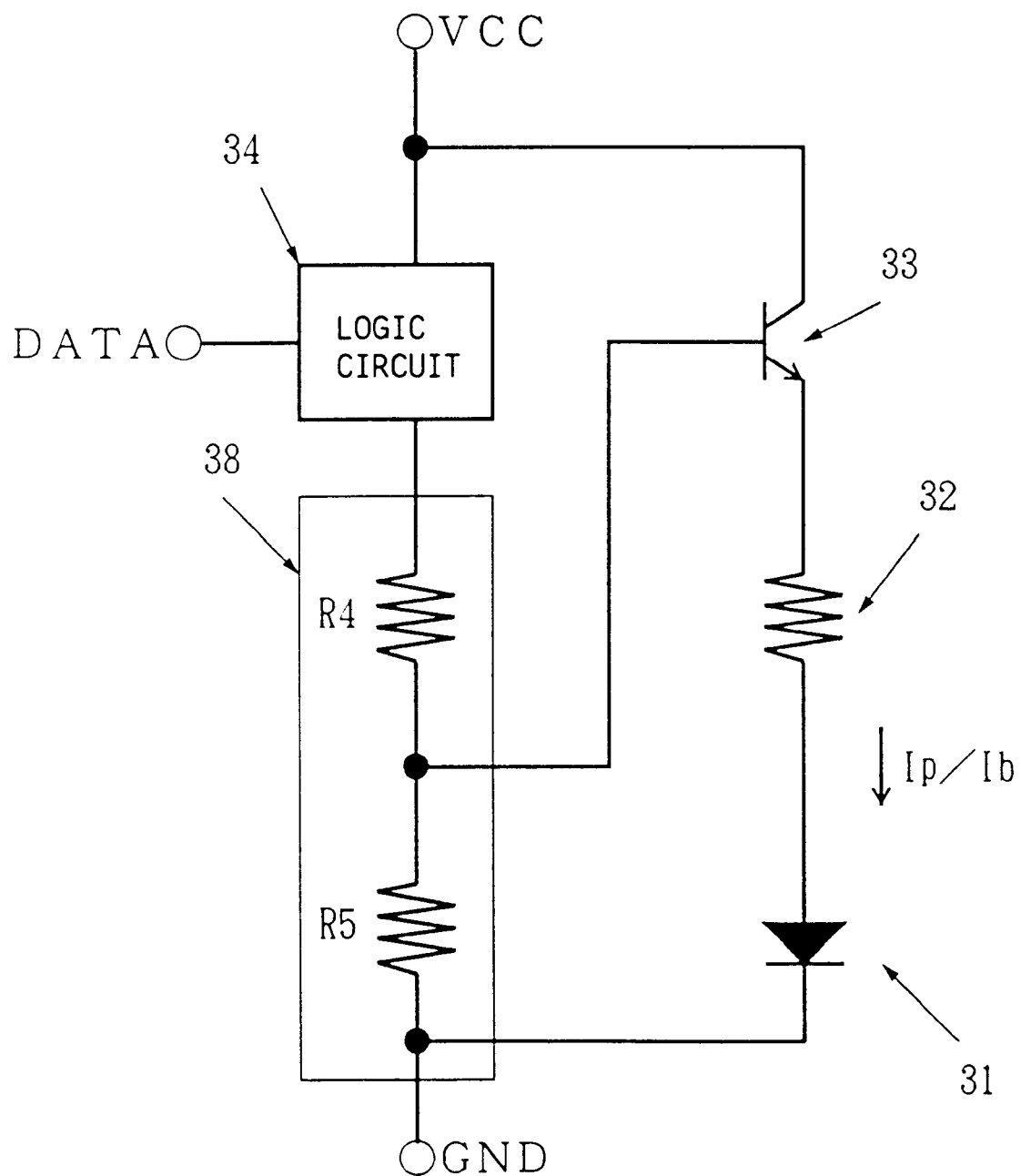
FIG. 15 is a circuit diagram of the detail of the light emitting element driving circuit according to the fifth embodiment of the present invention.

FIG. 15 shows the detail of the circuit shown in FIG. 7. The logic circuit 34 is, for example, MC100E416 produced by Motorola Inc. The drive transistor 33 is formed of an NPN transistor.

Figure 16:
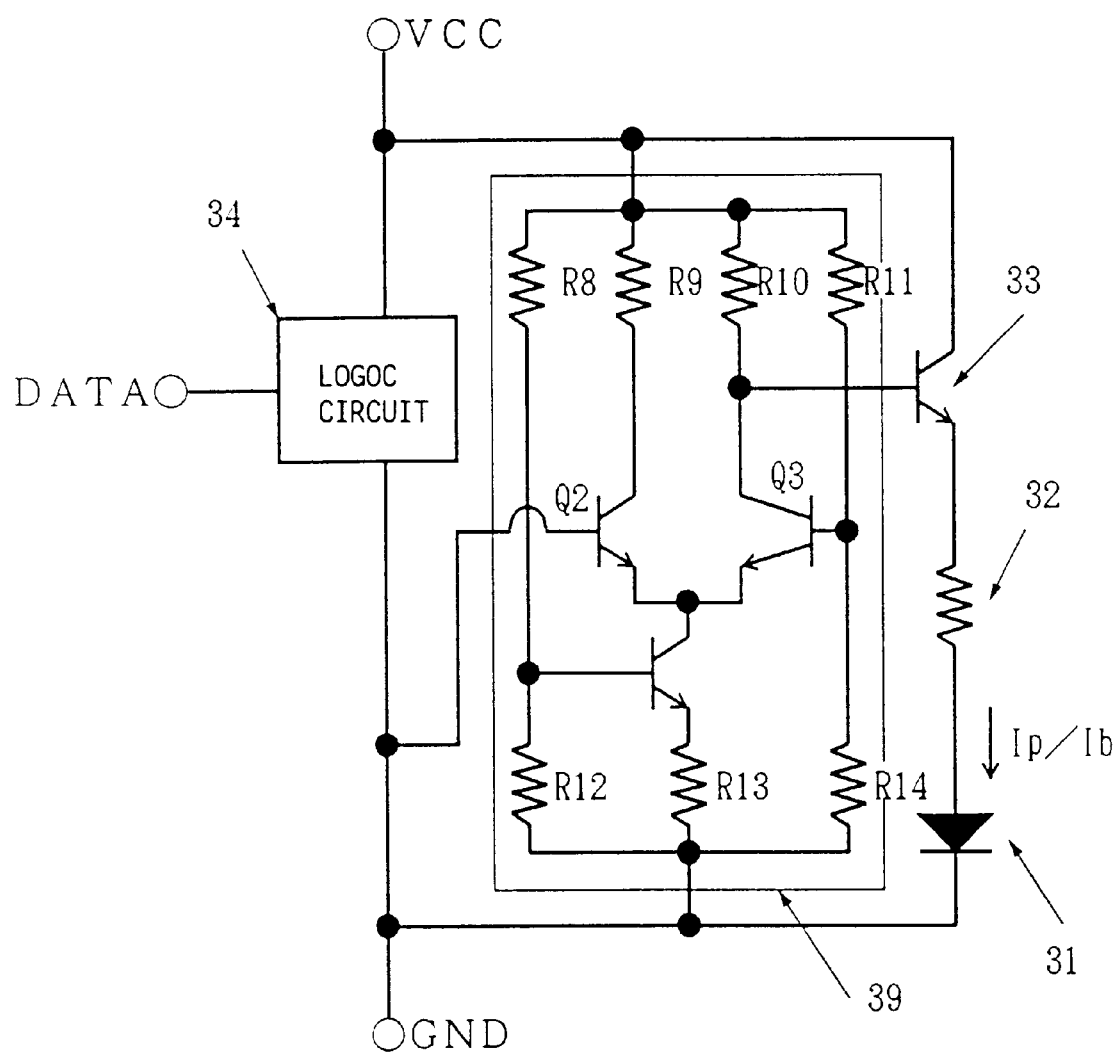
FIG. 16 is a circuit diagram of the detail of the light emitting element driving circuit according to the sixth embodiment of the present invention.

FIG. 16 shows the detail of the circuit shown in FIG. 8. The logic circuit 34 is, for example, MC100E416 produced by Motolora Inc. The drive transistor 33 is formed of an NPN transistor. The differential amplifier circuit 39 is made up of transistors Q2, Q3 and Q4, and resistors R8–R14. The base of the transistor Q2 is connected to the output terminal of the logic circuit 34. The base of the transistor Q3 is supplied with a reference voltage produced by the resistors R11 and R14. The output voltage dependent on the reference voltage is obtained at the collector of the transistor Q3, and is applied to the base of the drive transistor 33. The above output voltage corresponds to a voltage obtained by limiting the output amplitude ($V_{out(H)}-V_{out(L)}$) of the logic circuit 34. Hence, it is possible to set the pulse current Ip to a desired low level.

Figure 17:
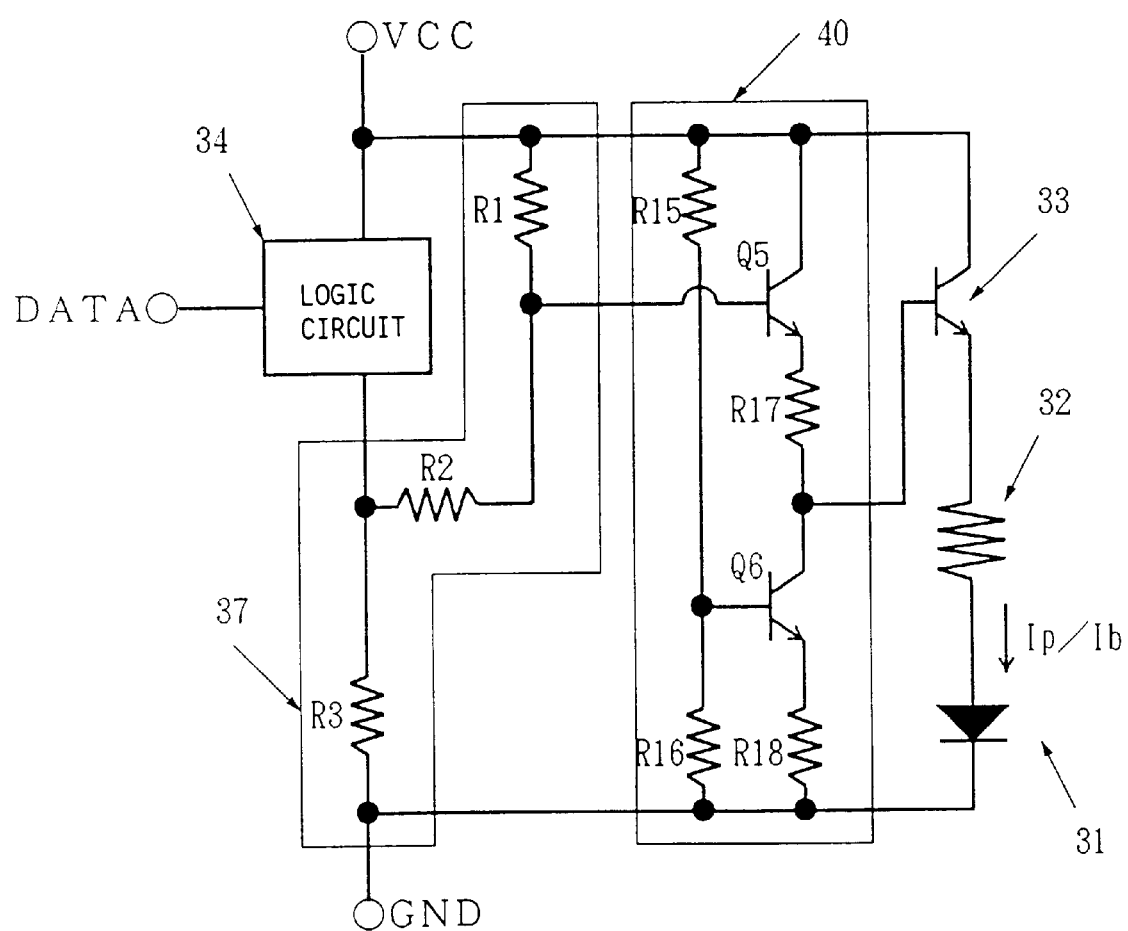
FIG. 17 is a circuit diagram of the detail of the light emitting element driving circuit according to the seventh embodiment of the present invention.

FIG. 17 shows the detail of the circuit shown in FIG. 9. The logic circuit 34 is, for example, MC100E416 produced by Motolora Inc. The drive transistor 33 is formed of an NPN transistor. The power supply voltage variation compensating circuit 40 is made up of transistors Q5 and Q6, and resistors R15–R18. If the power supply voltage VCC is increased, an increased current flows in the transistor Q5 and R17, and therefore the collector potential of the transistor Q6 is decreased. An increase in the power supply voltage VCC increases the base potential of the transistor Q5, and thus the collector potential of the transistor Q6 is also increased. As a result of the above operation, the collector potential can be maintained at the fixed level irrespective of the increase in the power supply voltage VCC, and the bias current Ib can be maintained at the constant level.

Figure 18:
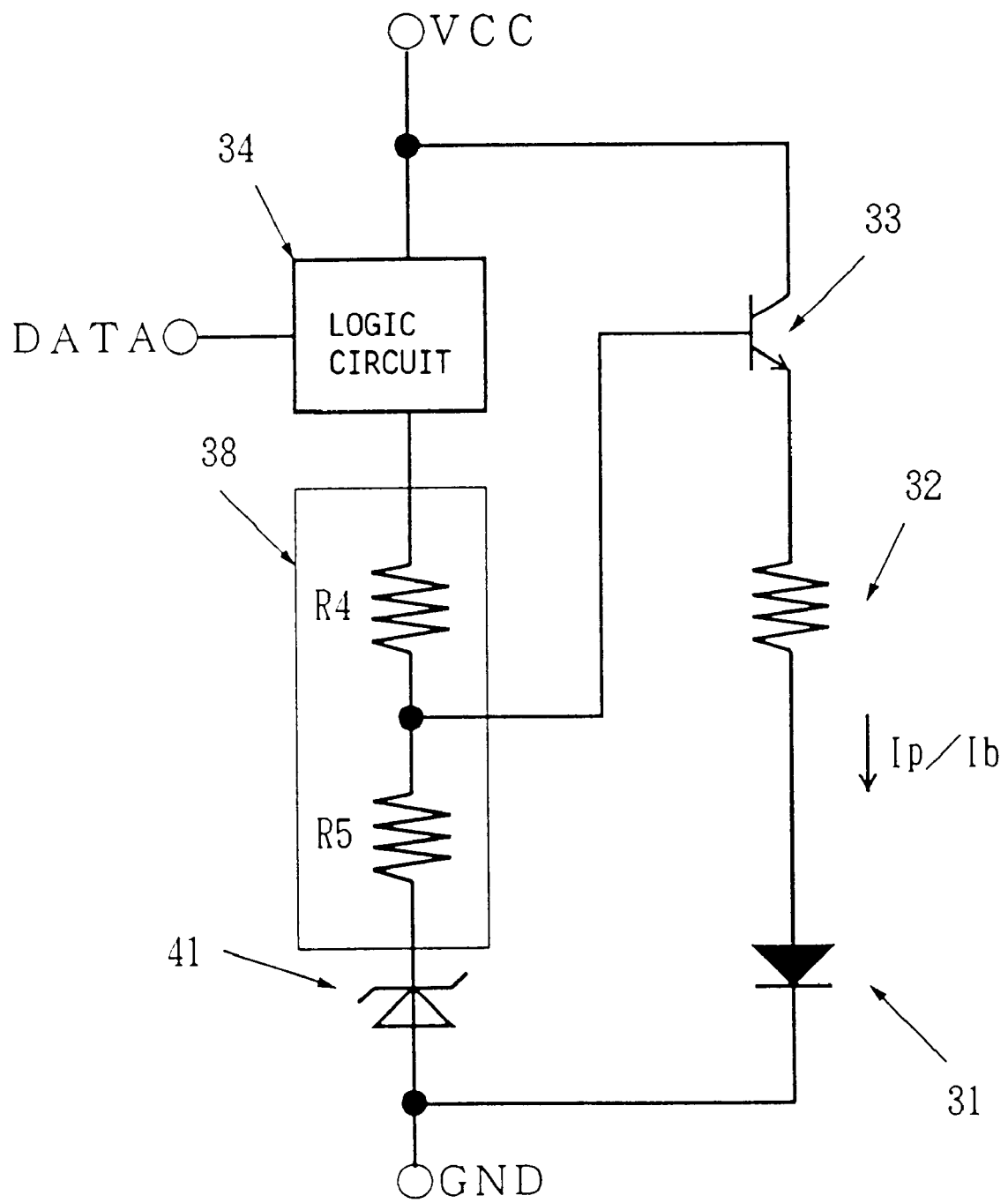
FIG. 18 is a circuit diagram of the detail of the light emitting element driving circuit according to the eighth embodiment of the present invention.

FIG. 18 shows the detail of the circuit shown in FIG. 10. The logic circuit 34 is, for example, MC100E416 produced by Motolora Inc. The drive transistor 33 is formed of an NPN transistor. The constant-voltage source 41 is formed by a Zener diode. A capacitor may be provided in parallel to the Zener diode in order to cause an AC component to bypass the Zener diode.

Figure 19:
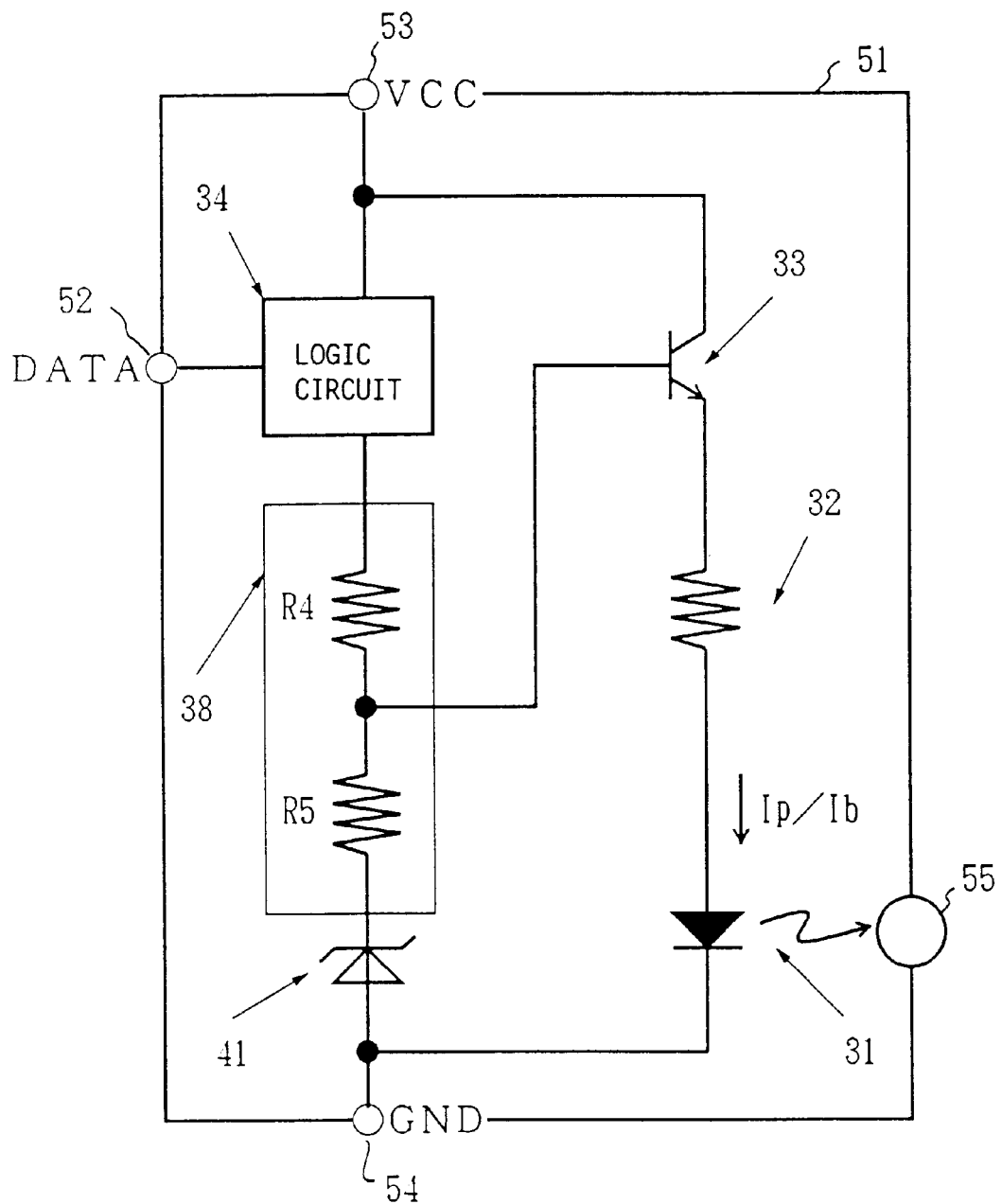
FIG. 19 is a circuit diagram of a light emitting device according to a ninth embodiment of the present invention.

FIG. 19 is a diagram of a light emitting device according to a ninth embodiment of the present invention. The light emitting device shown in FIG. 19 is a module device in which the structure shown in FIG. 18 is accommodated in a mold package 51. The package 51 is equipped with an input terminal 52, a power supply terminal 53, a ground terminal 54 and a connector 55. The input terminal 52 receives the input signal DATA. The power supply terminal 53 receives the positive power supply voltage VCC. The ground terminal 54 is grounded. The connector 55 is use to externally output the light emitted by the light emitting element 31. An optical fiber cable made of, for example, a glass or plastic material, can be connected to the connector 55. The connector 55 can be replaced by a window formed in the package 51. In this case, the light is directly emitted to the outside of the package 51 via the window. The circuit components can be mounted on a circuit board accommodated in the package 51.

The present invention is not limited to the specifically disclosed embodiments and variations and modifications may be made without departing from the scope of the present invention.

What is claimed is:

1. A light emitting element driving circuit which drives a light emitting element having an anode and a cathode, comprising:

a drive transistor coupled to a power supply voltage and having an emitter which is connected to the anode of the light emitting element, said drive transistor receiving an input signal and supplying the light emitting element with a pulse current and a bias current, the cathode of the light emitting element being connected to a lower potential than the power supply voltage.

2. The light emitting element driving circuit as claimed in claim 1, wherein said drive transistor is included in a logic circuit which performs a predetermined signal process on the input signal.

3. The light emitting element driving circuit as claimed in claim 2, further comprising a current adjusting circuit coupled to the light emitting element and provided separately from a resistance element coupled between said drive transistor and the light emitting element, said current adjusting circuit adjusting at least one of the pulse current and the bias current.

4. The light emitting element driving circuit as claimed in claim 3, wherein said current adjusting circuit comprises an attenuator attenuating output amplitude of a logic circuit performing a signal process on the input signal, so that the input amplitude of said drive transistor can be controlled by the attenuator.

5. The light emitting element driving circuit as claimed in claim 4, further comprising a compensating circuit maintaining the bias voltage defined by said control circuit at a given level irrespective of a variation in the power supply voltage.

6. The light emitting element driving circuit as claimed in claim 2, further comprising a level shift circuit connected in series to a resistance element and coupled between said drive transistor and the light emitting element, the level shift circuit adjusting the bias current.

7. The light emitting element driving circuit as claimed in claim 2, further comprising a constant-current source connected to the light emitting element, said constant-current source supplying the light emitting element with the bias current, so that a magnitude of the pulse current can be determined by a resistance element coupled between the drive transistor and the light emitting element.

8. The light emitting element driving circuit as claimed in claim 1, further comprising a current adjusting circuit coupled to the light emitting element and provided separately from a resistance element coupled between said drive transistor and the light emitting element, said current adjusting circuit adjusting at least one of the pulse current and the bias current.

9. The light emitting element driving circuit as claimed in claim 1, further comprising a level shift circuit connected in series to a resistance element and coupled between said drive transistor and the light emitting element, the level shift circuit adjusting the bias current.

10. The light emitting element driving circuit as claimed in claim 1, further comprising a constant-current source connected to the light emitting element, said constant-current source supplying the light emitting element with the bias current, so that a magnitude of the pulse current can be determined by a resistance element coupled between the drive transistor and the light emitting element.

11. The light emitting element driving circuit as claimed in claim 1, further comprising a control circuit controlling an input amplitude of said drive transistor so that the pulse current can be adjusted by changing the input amplitude.

12. The light emitting element driving circuit as claimed in claim 11, wherein said control circuit comprises a voltage dividing circuit attenuating an output amplitude of a logic circuit performing a signal process on the input signal, so that the input amplitude of said drive transistor can be controlled by said voltage dividing circuit.

13. The light emitting element driving circuit as claimed in claim 12, further comprising a compensating circuit maintaining the bias voltage defined by said control circuit at a given level irrespective of a variation in the power supply voltage.

14. The light emitting element driving circuit as claimed in claim 12, further comprising a constant-voltage source connected in series to the voltage dividing circuit, said constant-voltage source adjusting a bias voltage output by said voltage dividing circuit.

15. The light emitting element driving circuit as claimed in claim 12, wherein said voltage dividing circuit comprises a plurality of resistors including a variable resistor.

16. The light emitting element driving circuit as claimed in claim 11, wherein said control circuit comprises a differential amplifier circuit differentially amplifying an output amplitude of a logic circuit performing a signal process on the input signal, so that the input amplitude of said drive transistor can be controlled by an output signal of said differential amplifier circuit.

17. The light emitting element driving circuit as claimed in claim 16, further comprising a compensating circuit maintaining the bias voltage defined by said control circuit at a given level irrespective of a variation in the power supply voltage.

18. The light emitting element driving circuit as claimed in claim 11, further comprising a compensating circuit maintaining the bias voltage defined by said control circuit at a given level irrespective of a variation in the power supply voltage.

19. The light emitting element driving circuit as claimed in claim 1, wherein said drive transistor is an NPN transistor.

20. The light emitting element driving circuit as claimed in claim 1, wherein the power supply voltage is a positive power supply voltage and the lower potential is a ground level.

21. A light emitting device, comprising:

a light emitting element;

an input terminal receiving an input signal;

a light emitting element driving circuit driving said light emitting element; and an output part outputting a light emitted from said light emitting element to an outside of said light emitting device, said light emitting element driving circuit comprising a drive transistor coupled to a power supply voltage, the drive transistor having an emitter connected to an anode of said light emitting element, said drive transistor receiving the input signal and supplying said light emitting element with a pulse current and a bias current, wherein a cathode of said light emitting element is connected to a lower potential than the power supply voltage.

22. An optical transmitter, comprising:

a light emitting element; and a driving circuit driving said light emitting element, said driving circuit including:

a drive transistor coupled to a power supply voltage and having an emitter connect to an anode of said light emitting element, the drive transistor receiving an input signal and supplying said light emitting element with a pulse current and a bias current, wherein a cathode of said light emitting element is connected to a lower potential than the power supply voltage.

* * * * *